United States Patent
Kang et al.

(10) Patent No.: US 9,818,947 B2
(45) Date of Patent: Nov. 14, 2017

(54) SEMICONDUCTIVE ROLLER OF AN IMAGE-FORMING APPARATUS

(71) Applicant: S-PRINTING SOLUTION CO., LTD., Suwon-si, Gyeonggi-do (KR)

(72) Inventors: Kwang-ho Kang, Seoul (KR); Jae-hyeuk Jeong, Seoul (KR); Jung-ik Choi, Suwon-si (KR)

(73) Assignee: S-PRINTING SOLUTION CO., LTD., Suwon-si (KR)

( * ) Notice: Subject to any disclaimer, the term of this patent is extended or adjusted under 35 U.S.C. 154(b) by 460 days.

(21) Appl. No.: 14/168,422

(22) Filed: Jan. 30, 2014

(65) Prior Publication Data

US 2015/0087488 A1 Mar. 26, 2015

(30) Foreign Application Priority Data

Sep. 26, 2013 (KR) ........................ 10-2013-0114702

(51) Int. Cl.
*G03G 15/16* (2006.01)
*B05C 1/08* (2006.01)
(Continued)

(52) U.S. Cl.
CPC ....... *H01L 51/004* (2013.01); *G03G 15/0233* (2013.01); *G03G 15/0818* (2013.01); *G03G 15/1685* (2013.01); *H01L 51/0043* (2013.01)

(58) Field of Classification Search
CPC .. G03G 15/16; B05C 1/08; H01B 1/12; H01L 51/004; H01L 51/0043
See application file for complete search history.

(56) References Cited

U.S. PATENT DOCUMENTS

2011/0210296 A1* 9/2011 Yasuda .................... C08L 9/02
252/519.33
2012/0202663 A1 8/2012 Mizumoto et al.
(Continued)

FOREIGN PATENT DOCUMENTS

EP 2489700 8/2012
JP 2010-008440 1/2010
(Continued)

OTHER PUBLICATIONS

European Office Action dated Mar. 12, 2015 from European Patent Application No. 14157919.3, 4 pages.
(Continued)

*Primary Examiner* — Brian P Mruk
(74) *Attorney, Agent, or Firm* — Staas & Halsey LLP (57) ABSTRACT

A semiconductive roller to stably generate high-quality images for a long period of time by efficiently inhibiting migration of free epichlorohydrin (ECH) component to a surface of the semiconductive roller includes an elastic layer formed of a semiconductive rubber composition including about 50 to about 70 parts by weight of a base rubber and about 30 to about 50 parts by weight of a hydrin rubber. An extracted amount of the ECH component from the elastic layer is about 2% by volume or less, wherein the extracted amount is determined based on a reduced amount of chlorine (Cl) intensity measured using X-ray fluorescence (XRF) analysis performed before and after extraction of the ECH component from the elastic layer using tetrahydrofuran (THF).

11 Claims, 2 Drawing Sheets (51) Int. Cl.
*H01B 1/12* (2006.01)
*H01L 51/00* (2006.01)
*G03G 15/02* (2006.01)
*G03G 15/08* (2006.01)

(56) References Cited

U.S. PATENT DOCUMENTS

2013/0051870 A1 2/2013 Kuroda et al.
2013/0203573 A1* 8/2013 Satoyoshi .............. H01B 1/125
  492/59

FOREIGN PATENT DOCUMENTS

| | | |
|---|---|---|
| JP | 2010-072450 | 4/2010 |
| JP | 2010-122455 | 6/2010 |
| JP | 2010-145920 | 7/2010 |
| JP | 2010-266512 | 11/2010 |
| JP | 2011-141322 | 7/2011 |
| JP | 2011-164176 | 8/2011 |
| JP | 2011-164178 | 8/2011 |
| JP | 2012-008321 | 1/2012 |
| JP | 2012-108456 | 6/2012 |
| JP | 2012-189698 | 10/2012 |

OTHER PUBLICATIONS

Supplementary European Search Report dated Feb. 23, 2015 from European Patent Application No. 14157919.3, 3 pages.

* cited by examiner

SEMICONDUCTIVE ROLLER OF AN IMAGE-FORMING APPARATUS

CROSS-REFERENCE TO RELATED APPLICATIONS

This application claims priority under 35 U.S.C. §119 (a) from Korean Patent Application No. 10-2013-0114702, filed on Sep. 26, 2013, in the Korean Intellectual Property Office, the disclosure of which is incorporated herein by reference in its entirety.

BACKGROUND OF THE INVENTION

1. Field of the Invention

One or more exemplary embodiments of the present general inventive concept relate to a semiconductive roller used in an image-forming apparatus utilizing electrophotography, and more particularly, to a semiconductive roller capable of inhibiting surface migration phenomenon of free epichlorohydrin (ECH) component originated from a hydrin rubber, which has residues of a hydrin-based monomer so as to provide electrical conductivity.

2. Description of the Related Art

Electrophotographic image-forming apparatuses used in facsimile machines, laser printers, copying machines, and the like form a toner image as follows. First, a surface of a photosensitive layer of an electrophotographic photoreceptor is uniformly and electrostatically charged by a charging roller, and then the charged surface is exposed to a pattern of light, thus forming an electrostatic latent image. Then, a toner is provided in a vicinity of the electrostatic latent image by a developing roller, and toner droplets or particles collect in either charged or uncharged regions to form a toner image on the surface of the photosensitive layer. A resulting toner image formed on the photosensitive layer of the electrophotographic photoreceptor may be transferred to a suitable final or intermediate image receiving member such as a plain paper by a transfer member such as a transfer roller or a transfer belt, or the photosensitive layer may function as a final receptor to receive the toner image. Then, the toner image transferred onto the surface of the final or intermediate image receiving member is fixed.

A semiconductive roller can be used as the charging roller, the developing roller, and the transfer roller. U.S. Publication No. 2012/0202663 discloses a semiconductive roller prepared by applying a cross-linked product of a mixture of a hydrin rubber, as an electroconductive component, and a rubber having an unsaturated bond, to an elastic layer of the semiconductive roller. A semiconductive roller having an elastic layer that includes carbon black as an electroconductive component is also known in the art.

However, when the carbon black is used, a non-uniform image may be formed due to non-uniform electrical conductivity if the carbon black is not uniformly dispersed. When a hydrin rubber is used, the problem of non-uniform dispersion may be decreased because the hydrin rubber has high flowability and is compatible with other rubber components constituting a matrix of the elastic layer.

However, using hydrin rubber for a semiconductive roller may cause surface migration that could deteriorate image quality of an electrophotographic image-forming apparatus. Specifically, low-molecular weight materials, which is contained in a composition to form an elastic layer of the semiconductive roller, and free epichlorohydrin (ECH) component, which is contained in the hydrin rubber and is not bonded to the other rubber components due to incomplete cross-linking, may migrate onto the surface of the elastic layer, i.e., the surface of the semiconductive roller, due to pressurization or deformation under operating conditions of an image-forming apparatus, thereby eventually contaminating the surface of the transfer roller. Such surface migration phenomenon may increase over time.

The ECH component includes an ECH monomer and a hydrin rubber oligomer having flowability. Particularly, the ECH component, which tends to have a high chemical attack property, may cause damage to a photosensitive layer formed of a material vulnerable to chemicals on the surface of a photoreceptor, thereby causing defects of images or a decreased stability of images with increasing temperature. Particularly, when a polycarbonate is contained in the surface layer of the photoreceptor, the free ECH component that has migrated to the surface may attack the polycarbonate to make the surface layer of the photosensitive layer non-uniform, thereby causing defects of images.

In a transfer roller having a foamed elastic layer, surface migration phenomenon over time may be more serious than a transfer roller having a solid elastic layer, since the former of which has a shorter surface migration pathway for the free ECH component and is more deformed during operation of an image-forming apparatus.

SUMMARY

The present general inventive concept provides a semiconductive roller including an elastic layer having a hydrin rubber, wherein the semiconductive roller is capable of efficiently inhibiting surface migration phenomenon of the ECH component contained in the hydrin rubber.

Additional features and utilities of the present general inventive concept will be set forth in part in the description which follows and, in part, will be obvious from the description, or may be learned by practice of the general inventive concept.

Additional aspects will be set forth in part in the description which follows and, in part, will be apparent from the description, or may be learned by practice of the presented embodiments.

The forgoing and/or other features and utilities of the present general inventive concept are achieved by providing a semiconductive roller, including an elastic layer formed of a semiconductive rubber composition including about 50 to about 70 parts by weight of a base rubber and about 30 to about 50 parts by weight of a hydrin rubber, wherein an extracted amount of an epichlorohydrin (ECH) component from the elastic layer is about 2% by volume or less, wherein the extracted amount is determined based on a reduced amount of chlorine (Cl) intensity measured using X-ray fluorescence (XRF) analysis performed before and after extraction of the ECH component from the elastic layer using tetrahydrofuran (THF), wherein the extracted amount of the ECH component is calculated using a calibration curve, which is obtained by the XRF analysis, indicating a correlation between concentrations (in % by volume) of epichlorohydrin (ECH) contained in a plurality of the THF solutions including known different concentrations of ECH and the corresponding chlorine (Cl) intensities (in cps/μA) of the plurality of the THF solutions measured by the XRF analysis.

The hydrin rubber may be a copolymer including epichlorohydrin and at least one selected from the group including allyl glycidyl ether and ethylene oxide, wherein a content of epichlorohydrin is 20% by weight or greater based on a weight of the hydrin rubber, a complex viscosity at 100° C.

is in the range of about 70,000 Pa·s to about 100,000 Pa·s, and a Δη*/ΔT value is about 250 Pa·s/° C. or less, wherein ΔT is a temperature variation (in ° C.) when the temperature is changed from 60° C. to 100° C., and Δη* is a complex viscosity variation (in Pa·s) when the temperature is changed from 60° C. to 100° C. at an angular frequency of 1 rad/s.

The Δη*/ΔT value may be about 100 Pa·s/° C. or less.

The semiconductive roller may have an electrical resistance of about 10 to about 300 MΩ under a condition of at 23° C. and at a relative humidity (RH) of 55%.

The base rubber may include at least one selected from the group including an acrylonitrile-butadiene rubber (NBR), a styrene-butadiene rubber (SBR), a chloroprene rubber (CR), an isoprene rubber (IR), an acrylic rubber (ACM), an urethane rubber (UR), a butadiene rubber (BR), an ethylene-propylene-diene rubber (EPDM), and a silicone rubber (SiR).

The base rubber may be an acrylonitrile-butadiene rubber (NBR).

The semiconductive rubber composition may further include about 1 to about 30 parts by weight of an organic or inorganic filler.

The filler may be a nano-scale filler having an average particle diameter of about 10 to about 100 nm and includes one selected from the group including calcium carbonate, silica, and nano fibril cellulose (NFC).

The elastic layer may be a foamed layer or a solid layer.

The elastic layer may be formed on an outer circumferential surface of a shaft formed of an electroconductive material.

The semiconductive roller may be a transfer roller to transfer a toner image developed on a surface of a photoreceptor onto an image receiving member in an image-forming apparatus utilizing electrophotography.

The foregoing and/or other features and utilities of the present general inventive concept may also be achieved by providing a semiconductive roller, including an elastic layer formed of a semiconductive rubber composition including about 50 to about 70 parts by weight of a base rubber and about 30 to about 50 parts by weight of a hydrin rubber, wherein an extracted amount of an epichlorohydrin (ECH) component from the elastic layer is about 2% by volume or less, wherein the extracted amount is determined based on a reduced amount of chlorine (Cl) intensity measured using X-ray fluorescence (XRF) analysis performed before and after extraction of the ECH component from the elastic layer using tetrahydrofuran (THF), further including at least one nano-scale filler having an average particle diameter of about 10 to about 100 nm which is selected from the group including calcium carbonate, silica, and nano fibril cellulose (NFC), wherein the hydrin rubber is a copolymer including epichlorohydrin and at least one selected from the group including allyl glycidyl ether and ethylene oxide, wherein a content of epichlorohydrin is 20% by weight or greater based on a weight of the hydrin rubber, a complex viscosity at 100° C. is in the range of about 70,000 to about 100,000 Pa·s, and a Δη*/ΔT value is about 400 Pa·s/° C. or less, wherein ΔT is a temperature variation (in ° C.) when the temperature is changed from 60° C. to 100° C., and Δη* is a complex viscosity variation (in Pa·s) when the temperature is changed from 60° C. to 100° C. at an angular frequency of 1 rad/s, wherein the extracted amount of the ECH component is calculated using a calibration curve, obtained by the XRF analysis, indicating a correlation between concentrations (in vol %) of epichlorohydrin (ECH) contained in a plurality of the THF solutions including known different concentrations of ECH and the corresponding chlorine (Cl) intensities (in cps/μA) of the plurality of the THF solutions measured by the XRF.

The forgoing and/or other features and utilities of the present general inventive concept may also be achieved by providing a semiconductive roller to inhibit surface migration of a free epichlorohydrin (ECH) component, including an elastic layer including a rubber composition comprising about 50-70 parts by weight of a base rubber and about 30-50 parts by weight of a hydrin rubber, and the elastic layer includes an EPH component extracted from the elastic layer a plurality of times using a plurality of tetrahydrofuran (THF) solutions to calculate an amount of the extracted ECH component based on a correlation between ECH concentrations and corresponding chlorine intensities of the plurality of the THF solutions.

The extracted amount of the ECH component may be calculated using a calibration curve corresponding to the correlation.

The forgoing and/or other features and utilities of the present general inventive concept may also be achieved by providing a semiconductive roller to improve image quality of an image forming apparatus containing the semiconductive roller by inhibiting a surface migration of a free epichlorohydrin (ECH) component. The semiconductive roller may include an elastic layer formed of a semiconductor rubber composition comprising about 50-70 parts by weight of a base rubber and about 30-50 parts by weight of a hydrin rubber, and the elastic layer includes an ECH component of 2% or less in volume of the elastic layer to be extracted, wherein the extracted amount is determined by measuring chlorine intensities of the elastic layer before and after the extraction.

According to an exemplary embodiment of the present general inventive concept, the chorine intensities may be measured by X-ray fluorescence analysis. The determination of the extracted amount of the ECH component may include generating a curve to indicate a correlation between the known concentrations of the ECH component in a plurality of tetrahydrofuran (THF) solutions and their corresponding chorine intensities such that the extracted amount of the ECH component is determined based on its correlation with the chlorine intensities measured before and after the extraction.

The hydrin rubber of the elastic layer may be a copolymer comprising epichlorohydrin and at least one selected from a group including allyl glycidyl ether and ethylene oxide.

According to an exemplary embodiment of the present general inventive concept, the semiconductive roller may also include a coating layer formed on an outer surface of the elastic layer to further inhibit the surface migration of the ECH component.

The coating layer of the semiconductive roller may have a thickness of about 0.2 um-10 um.

Extracting the ECH component inhibits the surface migration of the free ECH component, thereby reduces the likelihood of forming a non-uniform photosensitive layer caused by an attack to the polycarbonate by the ECH component, and therefore greatly improve the image quality of the image-forming apparatus.

The forgoing and/or other features and utilities of the present general inventive concept may also be achieved by providing a method of making an elastic layer of a semiconductive roller to generate high-quality images by inhibiting surface migration phenomenon, which includes forming the elastic layer from a semiconductor rubber composition comprising about 50-70 parts by weight of a base rubber and about 30-50 parts by weight of a hydrin rubber, and extracting an epichlorohydrin (ECH) component of 2% or less in volume of the elastic layer, wherein the extracted amount is determined by measuring chlorine intensities of the elastic layer before and after the extraction based on a correlation between the ECH component and the corresponding chorine intensities in tetrahydrofuran (THF) solutions.

BRIEF DESCRIPTION OF THE DRAWINGS

These and/or other aspects will become apparent and more readily appreciated from the following description of the exemplary embodiments, taken in conjunction with the accompanying drawings in which.

These and/or other features and utilities of the present general inventive concept will become apparent and more readily appreciated from the following description of the exemplary embodiments, taken in conjunction with the accompanying drawings of which.

DETAILED DESCRIPTION OF THE EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures Hereinafter, a semiconductive roller according to an exemplary embodiment of the present general inventive concept will be described in detail.

Figure 1:
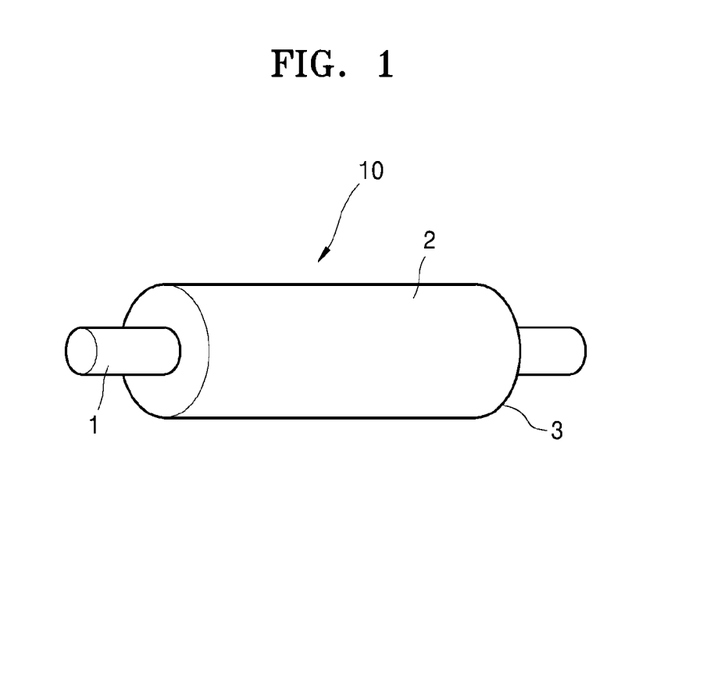
FIG. 1 is a perspective view illustrating a semiconductive roller according to an exemplary embodiment of the present general inventive concept.

FIG. 1 is a perspective view illustrating a semiconductive roller 10 according to an exemplary embodiment of the present general inventive concept.

Referring to FIG. 1, the semiconductive roller 10 includes a shaft 1 formed of an electroconductive material and a cylindrical elastic layer 2 formed on an outer circumferential surface of the shaft 1. Examples of the electroconductive material used to form the shaft 1 may be a metal, such as aluminum, an aluminum alloy, or stainless steel, but is not limited thereto. The shaft 1 and the elastic layer 2 are, for example, electrically bonded and mechanically fixed to each other by an electroconductive adhesive, or the like, to be integrally rotated during operation of an image-forming apparatus.

The elastic layer 2 may be a foamed layer or a solid layer. When the elastic layer 2 is a foamed layer, the surface migration phenomenon easily occurs due to a short surface migration pathway of an epichlorohydrin (ECH) component and a relatively high degree of the roller deformation during operation of an image-forming apparatus. The semiconductive roller 10 according to an exemplary embodiment of the present general inventive concept may efficiently inhibit surface migration phenomenon not only when the elastic layer 2 is a solid layer but also when the elastic layer 2 is a foamed layer.

Diameters of the shaft 1 and the elastic layer 2 are not limited. For example, the shaft 1 may have a diameter of about 5 mm to about 10 mm, and a total diameter of the shaft 1 and the elastic layer 2 may be about 10 mm to about 30 mm.

A coating layer 3 may further be formed on the outer circumferential surface of the elastic layer 2 to further inhibit the surface migration phenomenon of the free ECH component. However, the presence of the coating layer 3 may reduce electrical conductivity. Thus, there is a need to minimize the reduction of electrical conductivity. As such, the coating layer 3 may include a material that can efficiently inhibit surface migration phenomenon and improve electrical conductivity, such as a mixture of carboxymethyl cellulose (CMC) and nano fibril cellulose (NFC), a mixture of any cellulose derivatives other than CMC, but is not limited thereto. The coating layer 3 may also be formed of nano silica or other particles having nano-scale size such as nano precipitation calcium carbonate, but is not limited thereto. The coating layer 3 may be coated to have a thickness of about 0.2 μm to about 10 μm.

The semiconductive roller 10 may be a transfer roller that transfers a toner image developed on a surface of an electrophotographic photoreceptor onto an image receiving member in an image-forming apparatus utilizing electrophotography. The semiconductive roller 10 may also be a developing roller that develops the electrostatic latent image developed on a surface of an electrophotographic photoreceptor as a toner image by a charged toner in an image-forming apparatus utilizing electrophotography. The semiconductive roller 10 may also be a charging roller for uniformly and electrostatically charging a surface of an electrophotographic photoreceptor in an image-forming apparatus utilizing electrophotography.

The semiconductive roller 10 may be fabricated using a rubber composition including each of the following components using a known method. That is, a rubber composition is melted while being kneaded and heated, and extruded using an extruder into an elongate cylindrical shape through a die having a cross-sectional shape corresponding to that of the elastic layer 2, i.e., a ring shape. Then, the cylindrical extruded product was cooled to be solidified, and heated in an oven to be vulcanized.

The shaft 1 may include the outer circumferential surface being coated with an electroconductive adhesive, and may be inserted into the elastic layer 2 prepared as described above. When the electroconductive adhesive is a thermosetting adhesive, the elastic layer 2 is electrically bonded and mechanically fixed to the shaft 1 by curing the thermosetting adhesive by a heat treatment. The outer circumferential surface of the elastic layer 2 may be polished to have a predetermined surface roughness. In addition, the coating layer 3 may be formed using a method commonly used in the art. Accordingly, the semiconductive roller 10 as illustrated in FIG. 1 may be obtained.

The elastic layer 2 may be formed of a semiconductive rubber composition including about 50 to about 70 parts by weight of a base rubber and about 30 to about 50 parts by weight of a hydrin rubber having electrical conductivity. The base rubber may include at least one selected from the group comprising an acrylonitrile-butadiene rubber (NBR), a styrene-butadiene rubber (SBR), a chloroprene rubber (CR), an isoprene rubber (IR), an acrylic rubber (ACM), an urethane rubber (UR), a butadiene rubber (BR), an ethylene-propylene-diene rubber (EPDM), and a silicone rubber (SiR), but is not limited thereto. For example, the base rubber may be an acrylonitrile-butadiene rubber (NBR). That is, the elastic layer 2 may be formed of a semiconductive rubber composition including about 50 to about 70 parts by weight of an acrylonitrile-butadiene rubber (NBR) and about 30 to about 50 parts by weight of the hydrin rubber.

When the content of the hydrin rubber in the elastic layer 2 is less than 30 parts by weight, electrical resistance of the semiconductive roller 10 increases. When the content of the hydrin rubber in the elastic layer 2 is greater than 50 parts by weight, hardness of the elastic layer 2 decreases, so that the elastic layer 2 may be easily worn when contacts an image receiving member such as a plain paper. When the content of the base rubber increases, insulating properties of the elastic layer 2 increases, so that the elastic layer 2 may not be semiconductive anymore. The elastic layer 2 may include the hydrin rubber as a sole rubber material. However, the hydrin rubber may be used in combination with the base rubber in order to improve processability and productivity of the elastic layer 2.

The hydrin rubber includes a variety of polymers including ECH, more specifically an ECH residue, as a repeating unit. Examples of the hydrin rubber may include an epichlorohydrin homopolymer, an epichlorohydrin-ethylene oxide copolymer, an epichlorohydrin-propylene oxide copolymer, an epichlorohydrin-allyl glycidyl ether copolymer, an epichlorohydrin-ethylene oxide-allyl glycidyl ether tercopolymer, an epichlorohydrin-propylene oxide-allyl glycidyl ether tercopolymer, and an epichlorohydrin-ethylene oxide-propylene oxide-allyl glycidyl ether quaterpolymer, but are not limited thereto.

Particularly, the hydrin rubber may be a copolymer including ethylene oxide. In the copolymer, the content of ethylene oxide may be in the range of about 30% to about 95% by weight, for example, about 55% to about 95% by weight, or about 60% to about 80% by weight. Although ethylene oxide may reduce electrical resistance, the electrical resistance reduction may decrease when the content of ethylene oxide is less than the ranges described above. Meanwhile, when the content of ethylene oxide is greater than the ranges described above, ethylene oxide may be crystallized to prevent segment motions of molecular chains, and thus the electrical resistance tends to increase to the contrary. In addition, hardness of the elastic layer 2 may increase after cross-linking or viscosity of the rubber composition before the cross-linking may increase during the heating and melting process.

The hydrin rubber may be an epichlorohydrin-allyl glycidyl ether copolymer (GCO). In the GCO rubber, the content of allyl glycidyl ether may be in the range of about 30% to about 80% by weight, for example, about 50% to about 80% by weight. The content of ECH may be in the range of about 20% to about 70% by weight, for example, about 20% to about 50% by weight.

Particularly, the hydrin rubber may be an epichlorohydrin-ethylene oxide copolymer (ECO). The content of ethylene oxide may be in the range of about 30% to about 80% by weight, for example, about 50% to about 80% by weight. The content of ECH may be in the range of about 20% to about 70% by weight, for example, about 20% to about 50% by weight. The hydrin rubber may also be an epichlorohydrin (ECH)-ethylene oxide (EO)-allyl glycidyl ether (AGE) tercopolymer (GECO). The content of ethylene oxide may be in the range of about 30% to about 95% by weight, for example, about 60% to about 80% by weight. The content of ECH may be in the range of about 4.5% to about 65% by weight, for example, about 15% to about 40% by weight. The content of allyl glycidyl ether may be in the range of about 0.5% to about 10% by weight, for example, about 2% to about 6% by weight. The GECO may also include a modified product prepared by modifying an epichlorohydrin-ethylene oxide copolymer (ECO) with allyl glycidyl ether, in addition to the terpolymer of the three types of monomers. The GECO rubber has a stable electrical conductivity with excellent impact energy absorbing ability and excellent stability at low temperature. As the content of ECH increases, the GECO rubber has an increased ability to absorb physical impact energy and an improved stability at low temperature, but has a decreased elastic recovery.

As described above, the photosensitive layer formed of a chemically vulnerable substance and disposed on the surface of the photoreceptor may be damaged by the free ECH component, which tends to chemically attack the parts it contacts. Thus, a defective image may be formed, or stability of the image may be deteriorated as temperature increases. Thus, when the semiconductive roller according to an exemplary embodiment of the present general inventive concept is used as the transfer roller, migration of the free ECH component to the surface of the elastic layer 2 needs to be inhibited in order to efficiently prevent permanent damage to the surface of the photoreceptor.

To this end, in the semiconductive roller according to an exemplary embodiment of the present general inventive concept, an extracted amount of an epichlorohydrin (ECH) component from the elastic layer is controlled to be about 2% by volume or less. Here, the extracted amount is determined based on a reduced amount of chlorine (Cl) intensity measured using X-ray fluorescence (XRF) analysis performed before and after extraction of the ECH component from the elastic layer using tetrahydrofuran (THF). In this regard, the extracted amount of the ECH component is calculated using a calibration curve, which is obtained by the XRF analysis, indicating a correlation between concentrations (in % by volume) of epichlorohydrin (ECH) contained in a plurality of the THF solutions comprising known different concentrations of ECH and the corresponding chlorine (Cl) intensities (in cps/µA) of the plurality of the THF solutions measured by the XRF analysis.

Figure 2:
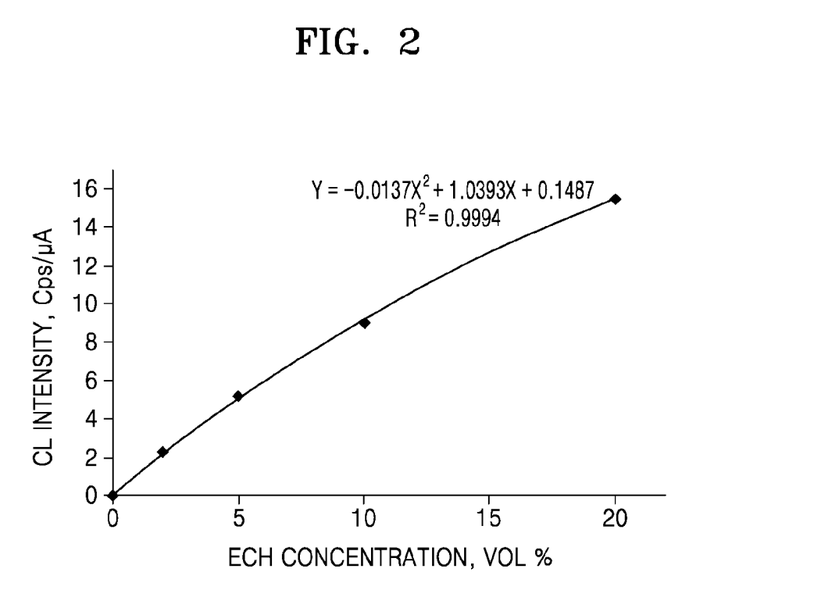
FIG. 2 is a graph illustrating a calibration curve that is used in evaluation of surface migration phenomenon of free ECH component of a semiconductive roller and indicates a correlation between concentrations (in vol %) of epichlorohydrin (ECH) contained in a plurality of the THF solutions comprising known different concentrations of ECH and the corresponding chlorine (Cl) intensities (in cps/μA) of the plurality of the THF solutions measured by the XRF analysis.

FIG. 2 is an example of the calibration curve obtained as described above. By using the pre-drawn calibration curve, the amount of ECH extracted from the elastic layer 2 may be readily determined from a reduced amount of chlorine (Cl) intensity measured using X-ray fluorescence (XRF) analysis performed before and after extraction of the ECH component from the elastic layer 2 using THF. The chlorine (Cl) intensity using the XRF analysis is an index indicating the amount of the ECH component.

According to an exemplary embodiment of the present general inventive concept, a hydrin rubber applicable to preparation of the elastic layer 2 in which the amount of the ECH component extracted therefrom is suppressed to 2% by volume or less, is a copolymer of epichlorohydrin and at least one selected from the group including allyl glycidyl ether and ethylene oxide, and the copolymer has the following properties: (1) a content of ECH is 6% or greater, for example, 20% by weight or greater, based on the weight of the hydrin rubber; and (2) a complex viscosity is in the range of about 70,000 Pa·s to about 100,000 Pa·s at 100° C.; and (3) $\Delta\eta^*/\Delta T$ value is about 250 Pa·s/° C. or less. Here, $\Delta T$ refers to a temperature variation (in ° C.) when the temperature is changed from 60° C. to 100° C., and $\Delta\eta^*$ refers to a complex viscosity variation (in Pa·s) when the temperature is changed from 60° C. to 100° C. at an angular frequency of 1 rad/s. Particularly, the $\Delta\eta^*/\Delta T$ value may be about 100 Pa·s/° C. or less from a viewpoint that the elastic layer 2 is controlled in such a manner that its extracted amount of the ECH component to be 2% by volume or less.

When the content of ECH is less than 20% by weight of the hydrin rubber, electrical resistance of the elastic layer 2 increases so as to lose electrical conductivity. When the complex viscosity is less than about 70,000 Pa·s at 100° C., the length of molecular chains of the rubber may decrease so that a lot of surface migration pathways of the free ECH component may be formed. When the complex viscosity is greater than about 100,000 Pa·s at 100° C., the viscosity of the rubber composition increases to deteriorate efficiency of extrusion molding. When the $\Delta\eta^*/\Delta T$ value is greater than about 250 Pa·s/° C., surface migration phenomenon of the free ECH component is not sufficiently suppressed. However, when the $\Delta\eta^*/\Delta T$ value is greater than about 250 Pa·s/° C. and less than about 400 Pa·s/° C., particularly, less than about 360 Pa·s/° C., the surface migration phenomenon of the free ECH component may be efficiently inhibited by adding a nano-scale filler having an average particle diameter of about 10 nm to about 100 nm.

The semiconductive roller may have an electrical resistance of about 10 MΩ to about 300 MΩ under a condition of at 23° C. and at a relative humidity (RH) of 55%. When the electrical resistance is not within the range described above, an electric field may not be generated due to too high or low electrical conductivity. In this case, the toner may not be transferred during operation of the image-forming apparatus.

The semiconductive rubber constituting the elastic layer is cross-linked to improve elasticity and inhibit surface migration of the free ECH component. The semiconductive rubber composition may include about 0.1 to about 2 parts by weight, for example, about 0.3 to about 1 part by weight of a cross-linking agent. In general, even when the content of the cross-linking agent is greater than about 2 parts by weight, the degree of cross-linking is not further increased.

Examples of the cross-linking agent may include sulfur, a thiourea cross-linking agent, a triazine-derivative-based cross-linking agent, a peroxide such as benzoyl peroxide, and various monomers, but are not limited thereto. Among them, sulfur may be used to perform high-speed vulcanization and efficiently prevent foaming or generation of air holes during high-speed vulcanization. The cross-linking agent may be used alone or in a combination of at least two thereof.

A cross-linking accelerator such as an inorganic accelerator and/or organic accelerator may be used. The semiconductive rubber composition may include about 0.1 to about 2 parts by weight, for example, about 0.3 to about 1 part by weight of the cross-linking accelerator. In general, when the content of the cross-linking accelerator is greater than about 2 parts by weight, cross-linking rates are not further increased. Examples of the inorganic accelerator include calcium hydroxide, magnesia (MgO), and lead oxide (PbO), but are not limited thereto. Examples of the organic accelerator include a guanidine-based accelerator such as 1,3-di-o-tolylguanidine, 1,3-diphenylguanidine, and di-o-tolyl guanidine salt of dicatechol borate, a thiazole-based accelerator such as mercaptobenzothiazole (commercially available under the trade name of ORICEL-M) and dibenzothiazil disulfide, a sulfenamide-based accelerator such as N-cyclohexyl-2-benzothiazyl sulfenamide, a thiuram-based accelerator such as tetramethyl thiuram monosulfide, tetramethyl thiuram disulfide, tetraethyl thiuram disulfide, and dipentamethylene thiuram tetrasulfide, a carbamate-based accelerator such as zinc diethyldithiocarbamate and zinc diburyldithiocarbamate, and a thiourea-based accelerator, but are not limited thereto. The cross-linking accelerator may be used alone or in a combination of at least two thereof.

The semiconductive rubber composition may further include about 0.1 to about 3 parts by weight, for example, about 0.3 to about 1 part by weight of a plasticizer. The plasticizer is added thereto in order to increase flowability of the rubber composition while extruding the rubber composition into the shape of the elastic layer 2, thereby facilitating the extruding process. Examples of the plasticizer include any plasticizer such as phthalates including dibutyl phthalate (DBP), dioctyl phthalate (DOP), and the like, adipates including dibutyl adipate and dioctyl adipate and the like, various waxes, and a vegetable oil, but are not limited thereto. The plasticizer may be used alone or in a combination of at least two thereof.

The semiconductive rubber composition may further include about 0.1 to about 3 parts by weight, for example, about 0.3 to about 1 part by weight of a process aid. The process aid is used to improve processibility of the extruding process, together with the plasticizer. Examples of the process aid include a fatty acid such as stearic acid and a metal salt of a fatty acid such as a meta salt of stearic acid, but are not limited thereto. The process aid may be used alone or in a combination of at least two thereof.

The semiconductive rubber composition may further include about 0.01 to about 3 parts by weight, for example, about 0.1 to about 1 part by weight of an antioxidant. The antioxidant is used to reduce environment dependency of electrical resistance of the semiconductive roller and to suppress increase of the electrical resistance of the roller during continuous applying of an electric current. Examples of the antioxidant include 2,2'-methylene-bis-(4-methyl-6-tert-butylphenol) (commercially available under the trade name of NAFTONOX 2246), nickel diethyldithiocarbamate, and nickel dibutyldithiocarbamate, but are not limited thereto. The antioxidant may be used alone or in a combination of at least two thereof.

The semiconductive rubber composition may further include about 1 to about 30 parts by weight, for example, about 1 to about 15 parts by weight of a filler. Examples of the filer include zinc oxide, silica, carbon, carbon black, clay, talc, calcium carbonate, magnesium carbonate, aluminum hydroxide, and titanium oxide, and the like, but are not limited thereto. The filler may be used alone or in a combination of at least two thereof. The filler may improve mechanical strength of the elastic layer 2.

When the semiconductive roller is used as a developing roller, adhesion of toner to the developing toner may be suppressed by adding titanium oxide thereto. When conductive carbon black is added as the filler, electrical conductivity of the elastic layer 2 may be improved. When a nano-scale filler having an average particle diameter of about 10 to about 100 nm is added thereto, a surface migration pathway of the free ECH component which is contained in the hydrin rubber and is not bonded to the other rubber components, i.e., a rubber matrix, may be efficiently blocked. Thus, surface migration phenomenon of the free ECH component may be more efficiently suppressed.

As the nano-scale filler, at least one selected from the group including calcium carbonate, silica, and nano fibril cellulose (NFC) may be efficiently used. By use of the nano-scale filler, surface migration phenomenon of the ECH component that is not cross-linked to the rubber, which is a main component causing surface migration phenomenon in the semiconductive roller, may be efficiently suppressed. Thus, when it is difficult to avoid the presence of the free ECH component, which is not cross-linked to the matrix rubber in the elastic layer 2, an organic/inorganic filler may be used to block the migration pathway toward the surface of the elastic layer 2.

The present general inventive concept will be described in further detail with reference to the following exemplary embodiments. However, these examples, experimental examples, and preparation examples are not intended to limit the purpose and scope of the one or more exemplary embodiments of the present general inventive concept.

Example 1

A hydrin rubber #5 (See Table 2) and NBR (Kumho Petrochemical Co., Ltd., and KNB 0230 L) were used as rubber materials for a rubber composition to form an elastic layer with formulation amounts as illustrated in Table 1. Sulfur powders (Tsurumi Chemical Industry, Co., Ltd., product name: SULFAX PN) were used as a cross-linking agent, mercaptobenzothiazole (Dong Yang Chemical Co., Ltd., ORICEL-M) was used as a vulcanization accelerator, and dioctyl phthalate (LG Chem. Ltd., DOP) was used as a plasticizer. As an antioxidant, 2,2'-methylene-bis-(4-methyl-6-tert-butylphenol)(NAFTONOX 2246) was used.

0.6 parts by weight of sulfur, 0.6 parts by weight of ORICEL-M, 0.6 parts by weight of DOP, and 0.06 parts by weight of NAFTONOX 2246 were mixed homogeneously based on 100 parts by weight of the total weight of the rubber materials including 37 parts by weight of the hydrin rubber and 63 parts by weight of the NBR.

The rubber composition was supplied to an extruder to obtain a cylindrical-shape molded part having an outer diameter of 12.5 mm and an inner diameter of 5 mm by extrusion-molding. Then, the cylindrical-shape part was continuously vulcanized in an oven at about 180° C. to about 220° C. to prepare an elastic layer. The prepared elastic layer was cut to a length of 250 mm, and a stainless steel shaft having an outer diameter of 5 mm and coated with an electroconductive thermosetting adhesive on the outer circumferential surface thereof is inserted into and fixed to the elastic layer. The outer circumferential surface of the elastic layer was polished to prepare a semiconductive roller having the shaft and elastic layer integrated to each other. Various properties of the semiconductive roller were evaluated. The evaluation results are illustrated in Table 1 below.

Example 2

A semiconductive roller was prepared in the same manner as in Example 1, except that a hydrin rubber #6 (See Table 2) was used instead of the hydrin rubber #5 in the preparation of the rubber composition to form the elastic layer. Various properties of the semiconductive roller were evaluated. The evaluation results are illustrated in Table 1 below.

Comparative Examples 1 Through 4

Semiconductive rollers were prepared in the same manner as in Example 1, except that a hydrin rubber #1 (Comparative Example 1), a hydrin rubber #2 (Comparative Example 2), a hydrin rubber #3 (Comparative Example 3), and a hydrin rubber #4 (Comparative Example 4) (See Table 2) were respectively used instead of the hydrin rubber #5 in the preparation of the rubber compositions to form the elastic layers. Various properties of the semiconductive rollers were evaluated. The evaluation results are illustrated in Table 1 below.

Examples 3 Through 5

Semiconductive rollers were prepared in the same manner as in Comparative Example 1, except that 5 parts by weight of nano precipitation calcium carbonate (NPCC) having an average particle diameter of about 50 nm (Example 3), nano silica (NS) having an average particle diameter of about 20 nm (Example 4), and nano fibril cellulose (NFC) having a fiber thickness of about 5 nm to about 50 nm and a fiber length greater than about 5 μm (Example 5) were further added to the rubber compositions respectively to form the elastic layers. Various properties of the semiconductive rollers were evaluated. The evaluation results are illustrated in Table 1 below.

Comparative Examples 5 Through 7

Semiconductive rollers were prepared in the same manner as in Comparative Example 2, except that 5 parts by weight of nano precipitation calcium carbonate (NPCC) having an average particle diameter of about 50 nm (Comparative Example 5), nano silica (NS) having an average particle diameter of about 20 nm (Comparative Example 6), and nano fibril cellulose (NFC) having a fiber thickness of about 5 to about 50 nm and a fiber length greater than about 5 μm (Comparative Example 7) were further added to the rubber compositions respectively to form the elastic layers. Various properties of the semiconductive rollers were evaluated. The evaluation results are illustrated in Table 1 below.

The properties of the semiconductive rollers illustrated in Table 1 are evaluated according to the following methods and criteria.

Measurement of Electrical Resistance of Semiconductive Roller

Electrical resistance of semiconductive rollers was measured as follows under a condition of a temperature of 23±3° C. and a relative humidity of 55±5% using a digital ultra-high resistance/microcurrent meter (Advantest Corporation, R8340A). Particularly, a roller sample was disposed on a metal flat electrode having an insulated back surface, and a load of 1 kg was applied over the roller sample. A voltage of 100 V was applied between the shaft of the roller sample and the flat electrode for 30 seconds, and then the resistance between the shaft and the flat electrode was measured.

Evaluation of Surface Migration Stability

When the semiconductive roller including the hydrin rubber is used, migration of the free ECH component onto the surface of the semiconductive roller causes contamination or damage to other members contacting the semiconductive roller, such as a photoreceptor. Thus, evaluation of the surface migration of the free ECH component of the semiconductive roller including the hydrin rubber is a direct index to evaluate quality of the semiconductive roller. Surface migration phenomenon of the free ECH component of the semiconductive roller was evaluated according to the following method.

① Specimen including five pieces each having a size of about 10 mm×10 mm and a thickness of about 7.5 mm are cut from the elastic layer of the semiconductive roller, and chlorine intensity [CI] (unit: cps/pA), which is an index of the content of ECH, is measured via X-ray fluorescence (XRF) analysis. The XRF analysis is performed using an Energy Dispersive X-Ray Spectrometer (EDX-720) (SHIMADZU). An X-ray tube voltage is 50 kV.

② The specimen is added to an Erlenmeyer flask containing 100 mL of reagent grade tetrahydrofuran (THF) and the flask is sealed and maintained at room temperature for about 12 hours.

③ All of the THF solvent is removed from the flask, and 100 mL of THF is newly added to the Erlenmeyer flask and the flask is sealed to wash the ECH component remaining in the specimen. The flask is shaken once, and then the THF solvent is removed.

④ Operation is repeated twice.

⑤ The specimen is placed in an oven dryer and dried at a temperature of 70±2° C. over about 6 hours.

⑥ CI intensity of the specimen after the THF extraction is measured using XRF analysis.

⑦ Reagent grade ECH is dissolved in reagent grade THF to prepare solutions having concentrations of 2%, 5%, 10%, and 20% (v/v). A calibration curve as illustrated in FIG. 2 is drawn by measuring CI intensities of the ECH solutions having the known concentrations using XRF analysis.

⑧ Concentration of the ECH component before and after the THF extraction is calculated using the calibration curve obtained in operation ⑦ based on the CI intensities of the specimen before and after the THF extraction obtained in operations ① and ⑥. Accordingly, an extracted amount of the free ECH component (vol %) from the specimen can be obtained by subtracting the concentration of the ECH component after the THF extraction from the concentration of the ECH component before the THF extraction. The increased amount of the extracted ECH component means that the degree of migration of the free ECH component to the surface of the elastic layer 2 of the semiconductive roller increases.

Surface migration stability of the semiconductive roller was evaluated based on the extracted amount of the free ECH component using the following criteria, as illustrated in Table 1.

◉: Extracted amount of the ECH component is less than 1.5% by volume.

○: Extracted amount of the ECH component is 1.5% by volume or greater and less than 2.0% by volume.

X: Extracted amount of the ECH component is 2.0% by volume or greater and less than 3.0% by volume.

XX: Extracted amount of the ECH component is 3.0% by volume or greater.

Evaluation of Initial Image Quality

A transfer roller was removed from a laser printer (product name: Monolaser printer ML-2165, Samsung Electronics, Co., Ltd.), and each of the semiconductive rollers prepared in Examples 1 through 5 and Comparative Examples 1 through 7 was mounted therein. Halftone printing was performed in an operation condition of 20 ppm using the printer. After printing 500 sheets, an initial image quality was evaluated based on occurrence of streaks.

○: Contaminations such as streaks were not visible in a printed image to the naked eye.

X: At least some of contaminations such as streaks were visible in a printed image to the naked eye.

Evaluation of Image Quality after Accelerated Aging Test of Semiconductive Roller Although an image-forming apparatus provided with the semiconductive roller may generate a high-quality image at an initial stage, the image quality may be deteriorated due to contamination or damage to the surface of the photoreceptor, or the like, as the semiconductive roller is aged. Taking this into consideration, aging resistance of the semiconductive roller was evaluated as follows.

① The photoreceptor and the semiconductive roller are tied with a force of 2 N and maintained in an oven at about 60° C. and a relative humidity of about 90%.

② Image quality is evaluated using the photoreceptor under a condition of 23° C. and RH 55% (under an NN environment) with the laser printer at every week for 6 weeks duration in total.

Figure 3A:
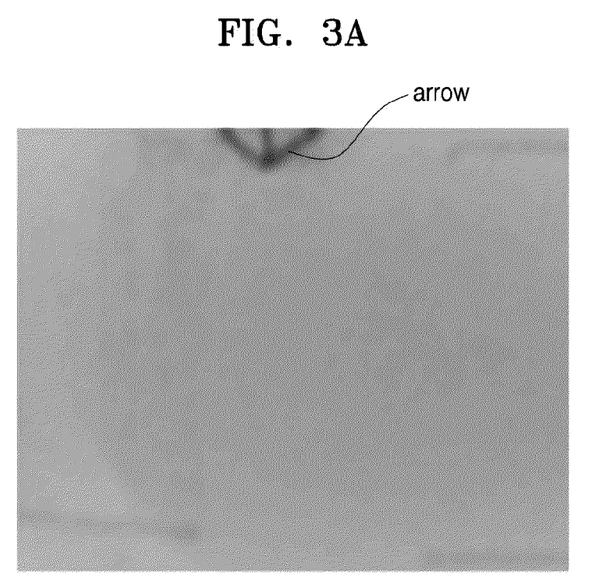
FIG. 3A illustrates a region of a plain printing paper with no image printed.
Figure 3B:
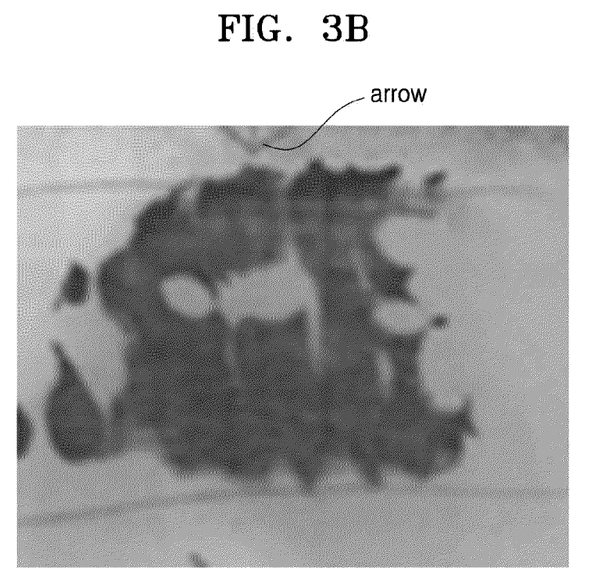
FIG. 3B illustrates a region of a plain printing paper with a defective image printed due to surface migration of the free ECH component.

③ The obtained image is evaluated as "No Change (NC)" or "No Good (NG)". The "No Change (NC)" refers to a situation that an image is not printed, as illustrated in FIG. 3A, on a region (a region below the arrow FIG. 3A) of a plain printing paper on which the image should not be printed as expected since the surface of the photoreceptor is intact. The "No Good (NG)" refers to a situation that a defective image is printed, as illustrated in FIG. 3B, on a region of a plain printing paper on which the image should not be printed since the surface of the photoreceptor is etched by the free ECH component that is migrated from the surface of the semiconductive roller.

Measurement of Complex Viscosity and Δη*/ΔT Value

The complex viscosity of the hydrin rubber at 100° C. and the Δη*/ΔT value that is a complex viscosity variation ratio when the temperature increases from 60° C. to 100° C. is measured using an advanced rheometric expansion system (ARES) based on a Dynamic Mechanical Analyzer (DMA) manufactured from Rheometric Scientific, Inc. according to a sinusoidal wave vibration method.

Measurement conditions: temperature range 60° C. to 100° C., angular frequency 1 rad/s, strain 1%, and heating rate 2° C./min.

Specimen size: a circular specimen having a diameter of 8 mm and a thickness of 1 mm.

Grip interval between two flat aluminum plates each having a diameter of 8 mm on which the specimen is disposed: 2 mm or less.

TABLE 1

|  |  | Examples |  |  |  |  | Comparative Examples |  |  |  |  |  |  |
|---|---|---|---|---|---|---|---|---|---|---|---|---|---|
|  |  | 1 | 2 | 3 | 4 | 5 | 1 | 2 | 3 | 4 | 5 | 6 | 7 |
| ECH* | #1 | — | — | 37 | 37 | 37 | 37 | — | — | — | — | — | — |
| rubber | #2 | — | — | — | — | — | — | 37 | — | — | 37 | 37 | 37 |
|  | #3 | — | — | — | — | — | — | — | 37 | — | — | — | — |
|  | #4 | — | — | — | — | — | — | — | — | 37 | — | — | — |
|  | #5 | 37 | — | — | — | — | — | — | — | — | — | — | — |
|  | #6 | — | 37 | — | — | — | — | — | — | — | — | — | — |
| NBR rubber* |  | 63 | 63 | 63 | 63 | 63 | 63 | 63 | 63 | 63 | 63 | 63 | 63 |
| Sulfur powders* |  | 0.6 | 0.6 | 0.6 | 0.6 | 0.6 | 0.6 | 0.6 | 0.6 | 0.6 | 0.6 | 0.6 | 0.6 |

TABLE 1-continued

|  |  | Examples | | | | | Comparative Examples | | | | | | |
|---|---|---|---|---|---|---|---|---|---|---|---|---|---|
|  |  | 1 | 2 | 3 | 4 | 5 | 1 | 2 | 3 | 4 | 5 | 6 | 7 |
| ORICEL-M* | | 0.6 | 0.6 | 0.6 | 0.6 | 0.6 | 0.6 | 0.6 | 0.6 | 0.6 | 0.6 | 0.6 | 0.6 |
| DOP* | | 0.6 | 0.6 | 0.6 | 0.6 | 0.6 | 0.6 | 0.6 | 0.6 | 0.6 | 0.6 | 0.6 | 0.6 |
| NAFTONOX 2246* | | 0.06 | 0.06 | 0.06 | 0.06 | 0.06 | 0.06 | 0.06 | 0.06 | 0.06 | 0.06 | 0.06 | 0.06 |
| Filler* | NPCC | — | — | 5 | — | — | — | — | — | — | 5 | — | — |
|  | NS | — | — | — | 5 | — | — | — | — | — | — | 5 | — |
|  | NFC | — | — | — | — | 5 | — | — | — | — | — | — | 5 |
| Evaluation results | Electrical resistance (MΩ) | 280 | 200 | 80 | 80 | 80 | 80 | 100 | 180 | 8 | 100 | 100 | 100 |
|  | Surface migration stability | ⊚ | ○ | ○ | ○ | ○ | X | XX | ⊚ | ○ | Δ | Δ | Δ |
|  | Initial Image quality | ○ | ○ | ○ | ○ | ○ | ○ | ○ | X | X | ○ | ○ | ○ |
|  | Image quality after accelerated aging | NC | NC | NC | NC | NC | NG | NG | NC | NC | NG | NG | NG |

*The formulation amounts are based on parts by weight

Compositions of the hydrin rubbers #1 through #6 used in Examples 1 through 5 and Comparative Examples 1 through 7, and their physical properties including complex viscosity and $\Delta\eta^*/\Delta T$ values are illustrated in Table 2 below.

TABLE 2

| Hydrin rubber | Composition of hydrin rubber (% by weight) | | | ECH content (%) | Complex viscosity (Pa · s @ 100° C.) | $\Delta\eta^*/\Delta T$ (60-100° C.) |
|---|---|---|---|---|---|---|
|  | ECH | EO | AGE | | | |
| #1 | 21.4 | 71.7 | 6.9 | 21.4 | 65,000 | 360 |
| #2 | 22.5 | 71.4 | 6.1 | 22.5 | 30,000 | 500 |
| #3 | 24.5 | 70.4 | 5.1 | 24.5 | 150,000 | 20 |
| #4 | 19.2 | 73.6 | 7.2 | 19.2 | 70,000 | 250 |
| #5 | 29.1 | 67.2 | 3.7 | 29.1 | 100,000 | 45 |
| #6 | 25.3 | 69.4 | 5.3 | 25.3 | 80,000 | 70 |

Referring to Tables 1 and 2, the semiconductive rollers prepared according to Examples 1 and 2 using the hydrin rubbers, which satisfy the conditions that (1) the content of ECH is 20% or greater based on the content of the hydrin rubber, (2) the complex viscosity is in the range of about 70,000 to about 100,000 Pa·s at 100° C., and (3) the $\Delta\eta^*/\Delta T$ value is about 250 Pa·s/° C. or less, have excellent surface migration stability since the amount of the ECH component extracted from the elastic layer is 2% by volume or less. Thus, it was confirmed that an image-forming apparatus using the semiconductive rollers prepared according to Examples 1 and 2 may stably produce high-quality images for a longer period of time.

On the contrary, it was also confirmed that the semiconductive rollers prepared according to Comparative Examples 1 and 2 using the hydrin rubber having the $\Delta\eta^*/\Delta T$ value greater than about 250 Pa·s/° C. had poor surface migration stability, and thus high-quality images could not be produced during a longer period of time although high-quality images were obtained at an initial stage. The semiconductive roller prepared according to Comparative Example 3 using the hydrin rubber having the complex viscosity greater than about 100,000 Pa·s at 100° C. had excellent surface migration stability but produced low-quality images at an initial stage since the hydrin rubber was not uniformly dispersed. Thus, an image-forming apparatus including the semiconductive roller according to Comparative Example 3 produced low-quality images at an initial stage. The semiconductive roller prepared according to Comparative Example 4 using the hydrin rubber having less than 20% of ECH based on the hydrin rubber had a poor toner transfer capability due to low electrical conductivity, thereby producing low-quality images at an initial stage. Thus, an image-forming apparatus including the semiconductive roller according to Comparative Example 4 produced low-quality images at an initial stage.

Meanwhile, although the semiconductive rollers according to Examples 3 through 5 were prepared respectively using the hydrin rubbers having the $\Delta\eta^*/\Delta T$ values greater than about 250 Pa·s/° C., surface migration stability was obtained by further adding a nano-scale filler having an average particle diameter of about 10 nm to about 100 nm selected from the group including calcium carbonate, silica, and nano fibril cellulose (NFC), since the $\Delta\eta^*/\Delta T$ values were less than about 400 Pa·s/° C. On the contrary, in Comparative Examples 5 through 7, the hydrin rubbers had too high $\Delta\eta^*/\Delta T$ values of about 500 Pa·s/° C., and thus surface migration stability was not obtained although the nano-scale filter was further added thereto.

Based on the results as described above, electrical properties are improved as the content of ECH of the hydrin rubber increases, and surface migration stability is improved as the $\Delta\eta^*/\Delta T$ value decreases. Thus, it was confirmed that high-quality images may be stably produced for a longer period of time by suppressing surface migration phenomenon of the free ECH component by using the semiconductive roller according to exemplary embodiments of the present general inventive concept, for example, as a transfer roller.

As described above, according to the one or more of the above exemplary embodiments of the present general inventive concept, although the semiconductive roller includes an elastic layer having a hydrin rubber, surface migration phenomenon of the free ECH component over time may be efficiently suppressed. Thus, when the semiconductive roller is used, for example, as a transfer roller, damage to the photoreceptor caused by surface migration phenomenon of the free ECH component from the elastic layer having a hydrin rubber of the transfer roller may be suppressed, thereby stably obtaining high-quality images during a longer period of time.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A semiconductive roller, comprising:
an elastic layer formed of a semiconductive rubber composition including:
about 50 to about 70 parts by weight of a base rubber; and
about 30 to about 50 parts by weight of a hydrin rubber as a copolymer inhibiting forming of migration pathways of free epichlorohydrin, the hydrin rubber as the copolymer including:
about 20% to about 29.1% epichlorohydrin by weight based on a weight of the hydrin rubber, and
at least one selected from the group consisting of allyl glycidyl ether and ethylene oxide,
wherein the about 20% to about 29.1% epichlorohydrin and the at least one selected from the group consisting of allyl glycidyl ether and ethylene oxide are copolymerized to have:
a complex viscosity in the range of about 70,000 to about 100,000 Pa·s at 100° C., and
a $\Delta\eta^*/\Delta T$ value of about 250 Pa·s/° C. or less, where
$\Delta T$ is a temperature variation in ° C. when the temperature is changed from 60° C. to 100° C., and
$\Delta\eta^*$ is a complex viscosity variation (in Pa·s) when the temperature is changed from 60° C. to 100° C. at an angular frequency of 1 rad/s,
thereby to inhibit the forming of the migration pathways of the free epichlorohydrin such that an extracted amount of the free epichlorohydrin from the elastic layer is about 2% by volume or less, where:
the extracted amount of the free epichlorohydrin is determined based on a reduced amount of chlorine (Cl) intensity measured using X-ray fluorescence (XRF) analysis performed before and after extraction of the free epichlorohydrin from the elastic layer using tetrahydrofuran (THF), and
the extracted amount of the free epichlorohydrin is calculated using a calibration curve, which is obtained by the XRF analysis, indicating a correlation between concentrations (in % by volume) of the free epichlorohydrin contained in a plurality of the THF solutions comprising known different concentrations of the free epichlorohydrin and the corresponding chlorine (Cl) intensities (in cps/μA) of the plurality of the THF solutions measured by the XRF analysis.

2. The semiconductive roller of claim 1, wherein the about 20% to about 29.1% epichlorohydrin and the at least one selected from the group consisting of allyl glycidyl ether and ethylene oxide are copolymerized to have the $\Delta\eta^*/\Delta T$ value of about 100 Pa·s/° C. or less.

3. The semiconductive roller of claim 1, wherein the elastic layer formed of the semiconductive rubber composition has an electrical resistance of about 10 to about 300 MΩ under a condition of at 23° C. and at a relative humidity (RH) of 55%.

4. The semiconductive roller of claim 1, wherein the base rubber comprises at least one selected from the group consisting of an acrylonitrile-butadiene rubber (NBR), a styrene-butadiene rubber (SBR), a chloroprene rubber (CR), an isoprene rubber (IR), an acrylic rubber (ACM), an urethane rubber (UR), a butadiene rubber (BR), an ethylene-propylene-diene rubber (EPDM), and a silicone rubber (SiR).

5. The semiconductive roller of claim 1, wherein the base rubber is an acrylonitrile-butadiene rubber (NBR).

6. The semiconductive roller of claim 1, wherein the semiconductive rubber composition further comprises about 1 to about 30 parts by weight of an organic or inorganic filler.

7. The semiconductive roller of claim 6, wherein the filler is a nano-scale filler having an average particle diameter of about 10 nm to about 100 nm and comprises one selected from the group consisting of calcium carbonate, silica, and nano fibril cellulose (NFC).

8. The semiconductive roller of claim 1, wherein the elastic layer is a foamed layer or a solid layer.

9. The semiconductive roller of claim 1, wherein the elastic layer is formed on an outer circumferential surface of a shaft formed of an electroconductive material.

10. The semiconductive roller of claim 1, wherein the semiconductive roller is a transfer roller to transfer a toner image developed on a surface of a photoreceptor onto an image receiving member in an image-forming apparatus utilizing electrophotography.

11. A semiconductive roller, comprising:
an elastic layer formed of a semiconductive rubber composition including:
about 50 to about 70 parts by weight of a base rubber;
at least one nano-scale filler having an average particle diameter of about 10 to about 100 nm and selected from the group consisting of calcium carbonate, silica, and nano fibril cellulose (NFC); and
about 30 to about 50 parts by weight of a hydrin rubber as a copolymer inhibiting forming of migration pathways of free epichlorohydrin, the hydrin rubber as the copolymer including:
about 20% to about 29.1% epichlorohydrin by weight based on a weight of the hydrin rubber, and
at least one selected from the group consisting of allyl glycidyl ether and ethylene oxide,
wherein the about 20% to about 29.1% epichlorohydrin and the at least one selected from the group consisting of allyl glycidyl ether and ethylene oxide are copolymerized to have:
a complex viscosity in the range of about 70,000 to about 100,000 Pa·s at 100° C., and
a $\Delta\eta^*/\Delta T$ value of about 250 Pa·s/° C. or less, where
$\Delta T$ is a temperature variation in ° C. when the temperature is changed from 60° C. to 100° C., and
$\Delta\eta^*$ is a complex viscosity variation (in Pa·s) when the temperature is changed from 60° C. to 100° C. at an angular frequency of 1 rad/s,
thereby to inhibit the forming of the migration pathways of the free epichlorohydrin such that an extracted amount of the free epichlorohydrin from the elastic layer is about 2% by volume or less, where:
the extracted amount of the free epichlorohydrin is determined based on a reduced amount of chlorine (Cl) intensity measured using X-ray fluorescence (XRF) analysis performed before and after extraction of the free epichlorohydrin from the elastic layer using tetrahydrofuran (THF), and
the extracted amount of the free epichlorohydrin is calculated using a calibration curve, which is obtained by the XRF analysis, indicating a correlation between concentrations (in % by volume) of the free epichlorohydrin contained in a plurality of the THF solutions comprising known different concentrations of the free epichlorohydrin and the corresponding chlorine (Cl) intensities (in cps/µA) of the plurality of THF solutions measured by the XRF analysis.

* * * * *